United States Patent
Chandrasekaran et al.

(10) Patent No.: US 8,557,680 B2
(45) Date of Patent: Oct. 15, 2013

(54) SEMICONDUCTOR WAFER-TO-WAFER BONDING FOR DISSIMILAR SEMICONDUCTOR DIES AND/OR WAFERS

(75) Inventors: Arvind Chandrasekaran, San Diego, CA (US); Brian M. Henderson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/545,393

(22) Filed: Jul. 10, 2012

(65) Prior Publication Data

US 2012/0276716 A1 Nov. 1, 2012

Related U.S. Application Data

(62) Division of application No. 12/547,520, filed on Aug. 26, 2009, now Pat. No. 8,242,543.

(51) Int. Cl.
*H01L 21/30* (2006.01)

(52) U.S. Cl.
USPC .... 438/458; 438/109; 257/235; 257/E27.026; 257/E27.512

(58) Field of Classification Search
USPC .................................. 438/109, 458; 257/235
See application file for complete search history.

(56) References Cited

U.S. PATENT DOCUMENTS

| | | | |
|---|---|---|---|
| 8,242,543 B2 | 8/2012 | Chandrasekaran et al. | |
| 2006/0267213 A1 | 11/2006 | Ozguz et al. | |
| 2007/0099345 A1 | 5/2007 | Bauer et al. | |
| 2008/0308921 A1* | 12/2008 | Kim | 257/686 |
| 2009/0065920 A1 | 3/2009 | Ahn et al. | |
| 2009/0065921 A1 | 3/2009 | Yamazaki et al. | |
| 2009/0130821 A1* | 5/2009 | Cox et al. | 438/455 |
| 2009/0140408 A1* | 6/2009 | Lee et al. | 257/686 |
| 2009/0316378 A1* | 12/2009 | Haba et al. | 361/808 |
| 2010/0155931 A1* | 6/2010 | Ray et al. | 257/698 |
| 2011/0006432 A1 | 1/2011 | Haba et al. | |
| 2011/0248410 A1* | 10/2011 | Avsian et al. | 257/777 |

FOREIGN PATENT DOCUMENTS

KR 0842915 7/2008

OTHER PUBLICATIONS

International Search Report and Written Opinion—PCT/US2010/046855, International Search Authority—European Patent Office—Nov. 18, 2010.
Val C, et al., "Stacking Technique of Known Good Rebuilt Wafers without Thru-Silicon Via Commercial Applications" Electronics Packaging Technology Conference, 2008. EPTC 2008. 10th, IEEE, Piscataway, NJ, USA, Dec. 9, 2008, pp. 1306-1310, XP031413982 ISBN: 978-1-4244-2117-6 pp. 1309-1310; figures 2,6 p. 1306.

\* cited by examiner

*Primary Examiner* — A. Sefer
(74) *Attorney, Agent, or Firm* — Michelle Gallardo

(57) ABSTRACT

A process for wafer-to-wafer bonding of a first wafer having a first set of dies of a first die size to a reconstituted wafer of a second set of dies having a second die size different than the first die size. The process includes aligning the second set of dies such that a second set of interconnects on the second set of dies aligns with a first set of interconnects on the first set of dies. The second set of dies includes a spacing between the second set of dies based on parameters of the first set of dies. The process also includes coupling the reconstituted wafer with the first wafer to create a wafer stack.

20 Claims, 9 Drawing Sheets

SEMICONDUCTOR WAFER-TO-WAFER BONDING FOR DISSIMILAR SEMICONDUCTOR DIES AND/OR WAFERS

CROSS REFERENCE TO RELATED APPLICATION

This application is a divisional of co-pending U.S. patent application Ser. No. 12/547,520 filed Aug. 26, 2009, entitled "SEMICONDUCTOR WAFER TO WAFER BONDING FOR DISSIMILAR SEMICONDUCTOR DIES AND/OR WAFERS."

TECHNICAL FIELD

The present disclosure generally relates to integrated circuits (ICs). More specifically, the present disclosure relates to manufacturing stacked integrated circuits.

BACKGROUND

Semiconductor dies include collections of transistors and other components in a wafer. Commonly, these wafers are semiconductor materials, and, in particular, silicon. The semiconductor wafers are singulated or diced to form semiconductor dies.

Semiconductor wafers may be stacked during manufacturing of products such as stacked ICs. Wafer-to-wafer bonding involves stacking the semiconductor wafers before being singulated into semiconductor dies. However, wafer-to-wafer bonding requires wafers and dies of equal size. Stacked ICs often include dies of different type or manufacturing process. For example, a stacked IC may have a memory device stacked on a processor. In this case, the memory device may not occupy as much die area as the processor.

When the dies do not align for wafer-to-wafer stacking, alternate semiconductor manufacturing techniques are employed. These less efficient techniques includes die-to-die bonding, die-to-substrate bonding, and die-to-wafer bonding. In die-to-substrate bonding, dies are placed on a substrate from two wafers, bonded and packaged to form a stacked die. In die-to-die bonding, two dies are individually stacked, bonded and packaged to form a stacked die. In die-to-wafer bonding, dies are individually placed on a wafer, bonded and packaged. All of these processes have low throughput compared with wafer-to-wafer processes.

Thus, there is a need for efficient semiconductor manufacturing of dissimilar die and/or wafer sizes.

BRIEF SUMMARY

According to one aspect of the disclosure, a semiconductor manufacturing process for wafer-to-wafer bonding of a first wafer having a first die to a reconstituted wafer having a second die includes aligning the second die of the reconstituted wafer such that a second interconnect on the second die aligns with a first interconnect on the first die. The method further includes coupling the reconstituted wafer with the first wafer to create a wafer stack.

According to another aspect of the disclosure, a wafer stack includes a first wafer having a first die with a first die interconnect structure. The wafer stack also includes a reconstituted wafer having a second die with a second die interconnect structure and a mold compound partially surrounding the second die. The first wafer is stacked on the reconstituted wafer such that the second die interconnect structure aligns with the first die interconnect structure.

According to yet another aspect of the disclosure, a wafer stack includes a first wafer having a first die. The wafer stack also includes means for arranging a second die to align with the first die.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
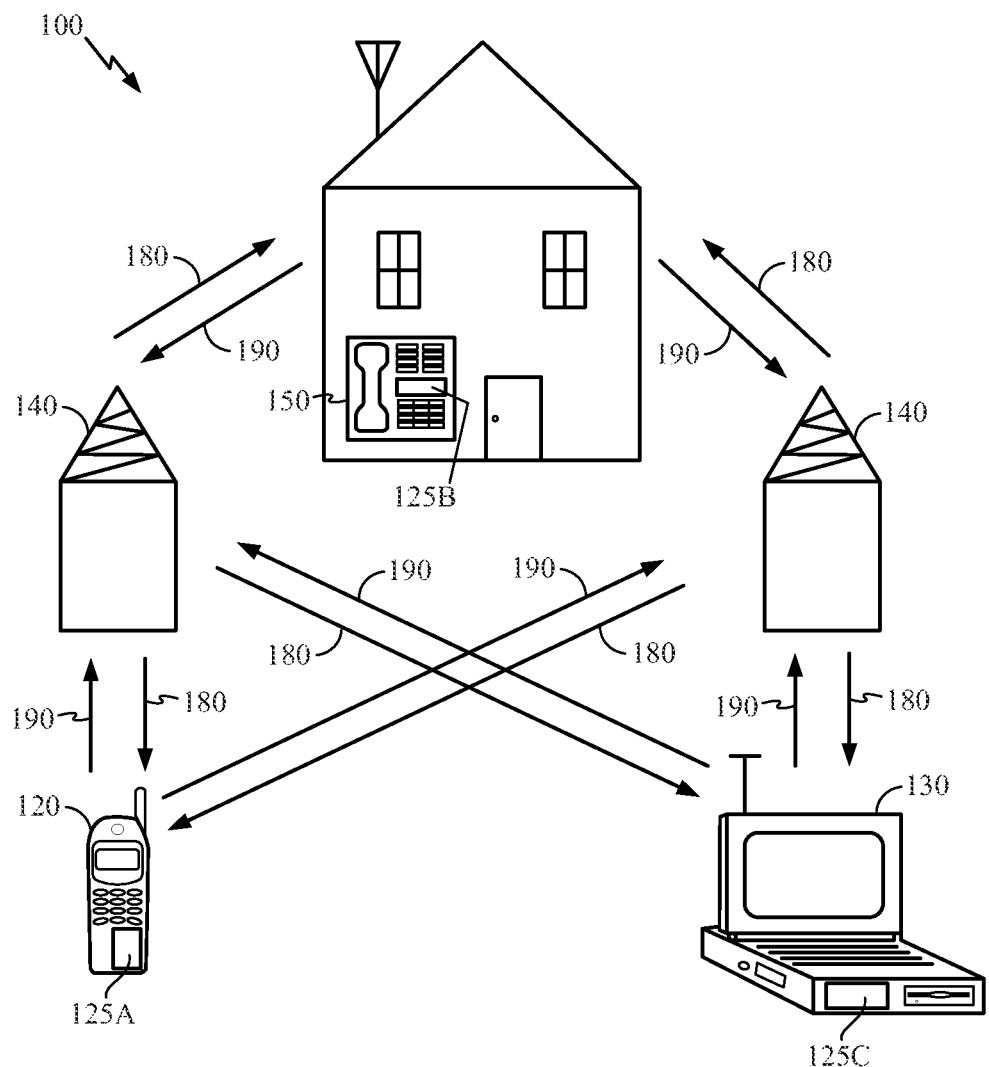
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, manufactured by the processes disclosed here. It will be recognized that any device containing an IC may also include semiconductor components haying the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. The disclosure may be suitably employed in any device which includes semiconductor components, as described below.

Figure 2:
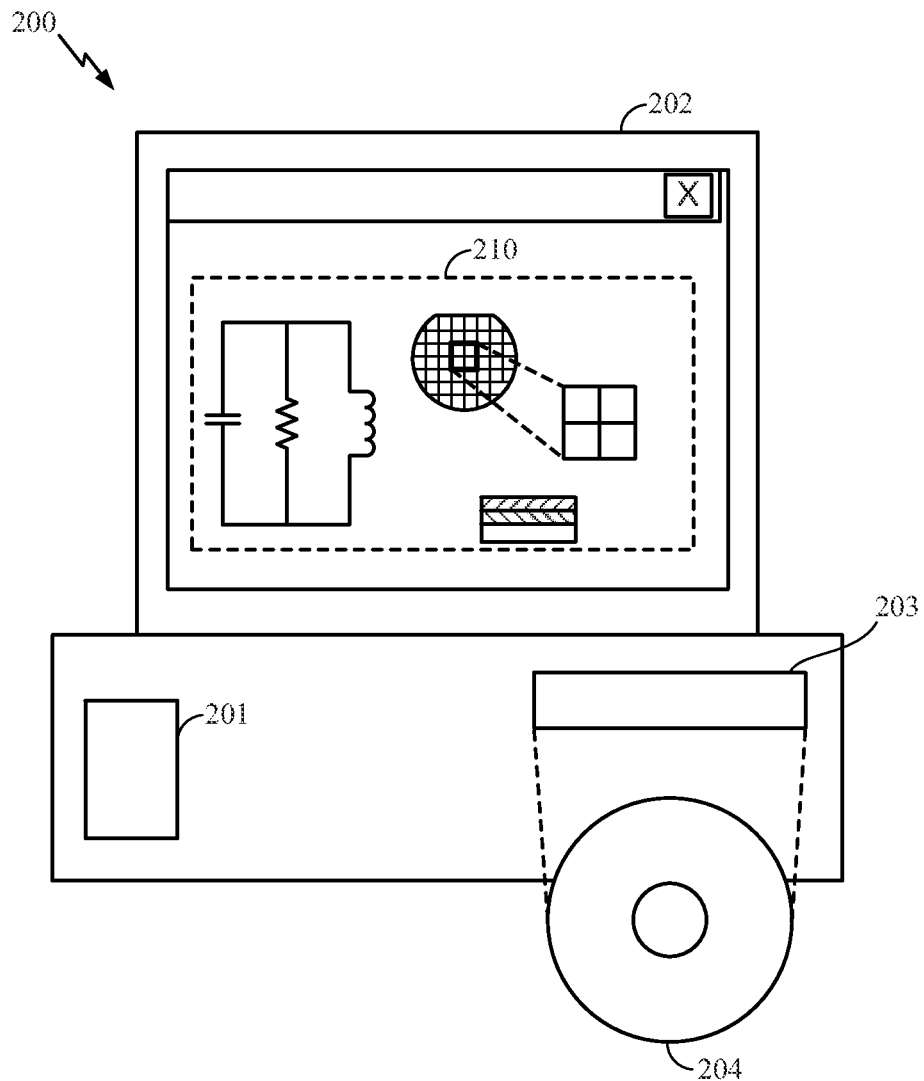
FIG. 2 is a block diagram illustrating a design workstation used for circuit, layout, and logic design of the disclosed semiconductor IC package.

FIG. 2 is a block diagram illustrating a design workstation for, layout, wafer, and die design of a semiconductor part as disclosed below. A design workstation 200 includes a hard disk 201 containing operating system software, support files, and design software such as Cadence or OrCAD. The design workstation 200 also includes a display to facilitate design of a semiconductor part 210 that may include a semiconductor wafer, and/or a semiconductor die. A storage medium 204 is provided for tangibly storing the semiconductor part 210. The semiconductor part 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify configurations, pattern data for photolithography masks, or mask pattern data for serial write tools such as electron beam lithography. Providing data on the storage medium 204 facilitates the design of the semiconductor part 210 by decreasing the number of processes for manufacturing and/or designing semiconductor wafers, and/or semiconductor dies.

Wafer-to-wafer bonding using reconstituted wafers as one wafer of a wafer stack allows a stacking process with high throughput for wafers and/or dies of dissimilar size. In one embodiment, a stacked IC having different size dies on each tier may be manufactured using wafer-to-wafer bonding. Additionally, the exemplary wafer-to-wafer processing described has limited sourcing variables such that components of a wafer stack may be manufacturing at different locations. The reconstituted wafer in the wafer-to-wafer bonding reduces problems with adhesives during attachment of carrier wafers to semiconductor assemblies. Further, wafer-to-wafer bonding leverages existing processes to reduce cost and time consumed during manufacturing.

FIGS. 3A-3D are block diagrams illustrating a top-down view of an exemplary stacking of dissimilar size dies and/or wafers according to one embodiment. Bonding of dissimilar size dies and/or wafers as described above allows construction of customized stacked dies.

Figure 3A:
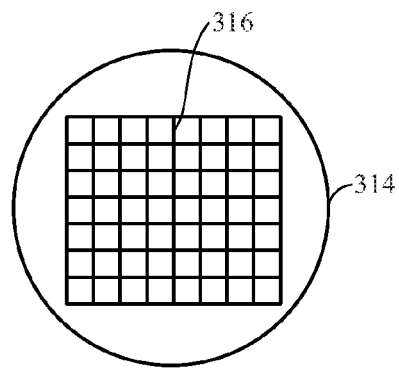
FIG. 3A is a top-down view illustrating a wafer from which the tier two dies are singulated, according to one embodiment.

FIG. 3A is a top-down view illustrating a wafer from which the tier two dies are singulated, according to one embodiment. A wafer 314 includes dies 316. The dies 316 are dissimilar in size relative to tier one dies. The wafer from which the tier two dies originate may also be dissimilar in size relative to a tier one wafer.

Figure 3B:
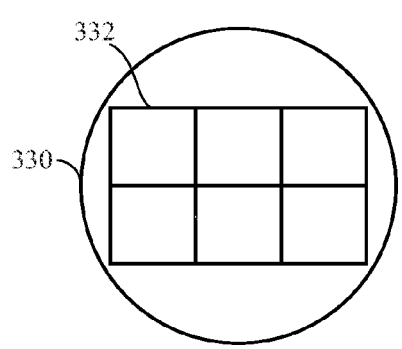
FIG. 3B is a top-down view illustrating a tier one wafer according to one embodiment.

FIG. 3B is a top-down view illustrating a tier one wafer according to one embodiment. A wafer 330 includes dies 332. Size of the dies 332 are dissimilar from the dies 316.

Figure 3C:
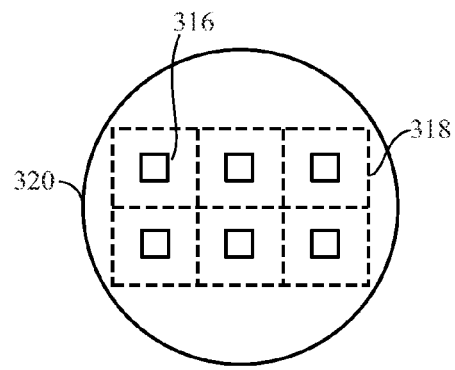
FIG. 3C is a top-down view illustrating a reconstituted wafer according to one embodiment.

FIG. 3C is a top-down view illustrating a reconstituted wafer according to one embodiment. After singulating or dicing the dies 316 from the wafer 314, the dies 316 are molded on a reconstituted wafer 320. A spacing 318 of the dies 316 on the reconstituted wafer 320 is chosen, in part, based on the layout and pitch of the dies 332 on the wafer 330.

Thus, when the reconstituted wafer 320 is bonded to the wafer 330 the dies 316 overlap the dies 332. Additionally, interconnects (not shown) of the dies 316 align with interconnects on the dies 332.

Figure 3D:
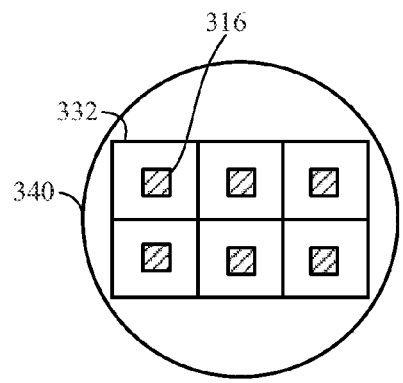
FIG. 3D is a top-down view illustrating a stacked wafer after exemplary wafer-to-wafer bonding according to one embodiment.

FIG. 3D is a top-down view illustrating a stacked wafer after exemplary wafer-to-wafer bonding according to one embodiment. The reconstituted wafer 320 and the wafer 330 are bonded according to a wafer-to-wafer bonding described below to form a bonded wafer stack 340. The dies 332 of a first tier, and the dies 316 of a second tier overlap interconnect structures (not shown). That is, the pitch of the dies 316 match the pitch of dies 332. Interconnects on the dies 332 are arranged to contact interconnects on the dies 316.

Figure 4A:
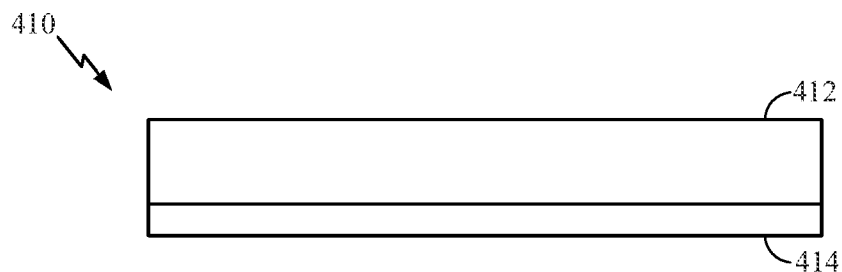
FIG. 4A is a cross-sectional view illustrating a semiconductor wafer according to one embodiment.
Figure 4B:
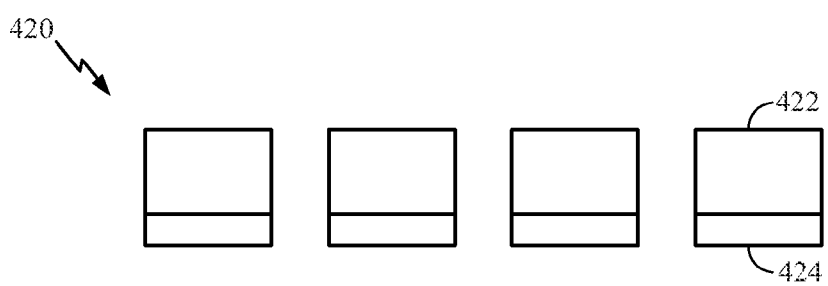
FIG. 4B is a cross-sectional view illustrating a semiconductor wafer after singulating into semiconductor dies and arranging to match tier one dies according to one embodiment.
Figure 4C:
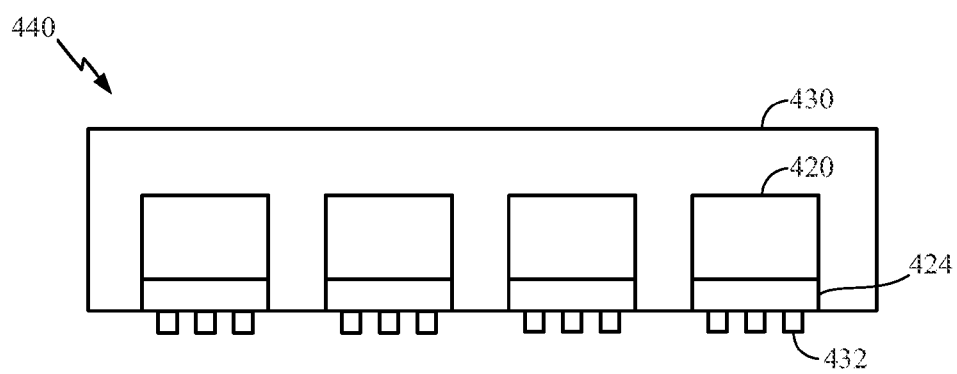
FIG. 4C is a cross-sectional view illustrating a semiconductor wafer, after wafer reconstitution according to one embodiment.

Reconstituting dies allows dies previously singulated from a wafer to be molded into a new wafer. Turning now to FIGS. 4A-4C a process for forming a reconstituted wafer will be described.

FIG. 4A is a cross-sectional view illustrating a semiconductor wafer according to one embodiment. A wafer 410 includes an active portion 414 and a substrate portion 412. The wafer 410 may also include various film layers (not shown) deposited on either side of the wafer 410.

FIG. 4B is a cross-sectional view illustrating a semiconductor wafer after singulating into semiconductor dies and arranging to match tier one dies according to one embodiment. The wafer 410 may be diced or singulated into dies 420. Each of the dies 420 includes an active portion 424, a substrate portion 422, and film layers (not shown) on the wafer 410. The dies 420 may be formed into a wafer using molding compound. The dies 420 are arranged in a layout according to a desired spacing of the dies 420. For example, according to one embodiment, the spacing may be chosen to match dies of a wafer to be stacked with the dies 420.

FIG. 4C is a cross-sectional view illustrating a semiconductor wafer, after wafer reconstitution according to one embodiment. A molding compound 430 is fixed around the dies 420 to form a reconstituted wafer 440. Thus, a spacing of the dies 420 after placement in the molding compound 430 and a wafer size of the reconstituted wafer 440 may be selected by appropriately arranging the dies 420 above in FIG. 4B.

Figure 5:
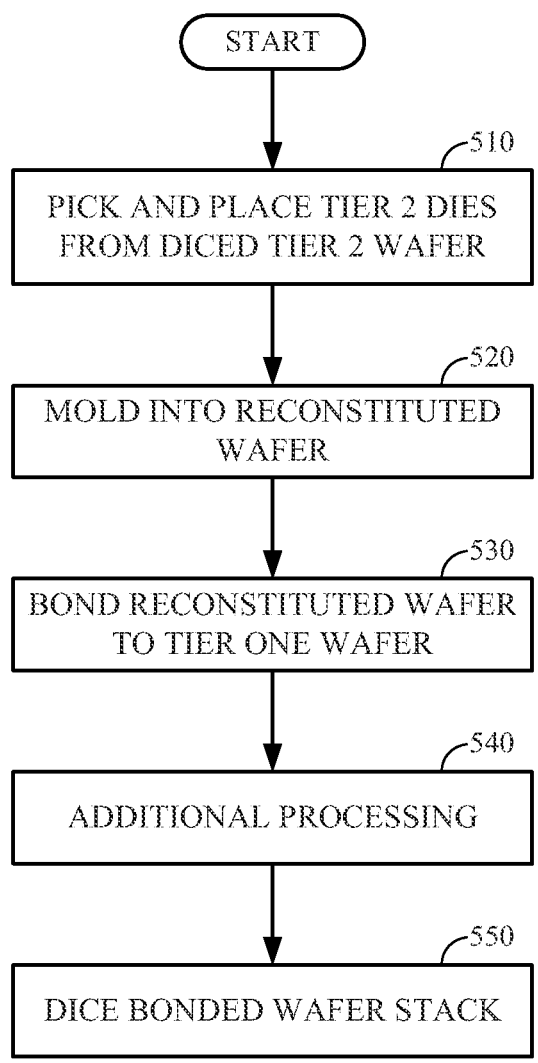
FIG. 5 is a flow chart illustrating an exemplary process for wafer-to-wafer bonding of dissimilar dies and/or wafers according to one embodiment.

Wafer-to-wafer bonding using a reconstituted wafer to manufacture a stacked IC will now be described. FIG. 5 is a flow chart illustrating an exemplary process for wafer-to-wafer bonding of dissimilar dies and/or wafers according to one embodiment.

At block 510 tier two dies are picked and placed for molding into a reconstituted wafer. The tier two dies may be placed to achieve a spacing that matches that of the dies on a tier one wafer. When the tier two dies have a spacing that matches that of the tier one dies, wafer-to-wafer bonding may be used. Additionally, die interconnects of the tier two dies may align with die interconnects of the tier one dies to enable communication between the tier one dies and the tier two dies.

At block 520 tier two dies are molded together to form a reconstituted wafer. According to one embodiment, the tier two dies may comprise stacked dies that are molded together to form the reconstituted die. In this case, the tier two die may be a vertically stacked memory device. The size of the molding may be selected to create an equivalent wafer size of the reconstituted wafer to match the size of the tier one wafer.

At block 530, the reconstituted wafer is bonded to a tier one wafer to form a bonded wafer stack. In one embodiment, the tier two dies on the reconstituted wafer are arranged before molding the tier two dies in place such that after bonding to the tier one wafer, interconnect structures of the tier two dies correspond with interconnect structures of the tier one dies. In another embodiment, multiple sizes of tier two dies are molded into the reconstituted wafer.

At block 540 additional manufacturing processes are carried out on the tier one wafer such as deposition of a redistribution layer (RDL) and flip chip (FC) bumps. Additionally, during additional processing the tier one wafer may be thinned. The mechanical strength of the bonded wafer stack is proportional to the cumulative thickness of the reconstituted wafer and the tier one wafer. Thus, thinning the tier one wafer does not put the bonded wafer stack at a substantially greater risk of breaking.

Blocks 510, 520, 530, and 540 may be repeated multiple times to build stacked dies having more than two tiers. At block 550, the stacked wafer is singulated or diced into individual dies. Although shown as individual blocks, there may be several semiconductor manufacturing processes carried out at each block shown above.

The wafer-to-wafer bonding described above in FIG. 5 allows construction of stacked ICs without the use of carrier wafers for the tier one wafer. Eliminating carrier wafers from semiconductor manufacturing improves throughput and reduces cost. For example, when a tier one wafer is thinned without a carrier wafer, the tier one wafer may lose mechanical stability and break during manufacturing. Attaching the reconstituted wafer to the tier one wafer before thinning places the tier one wafer at reduced risk from damage due to mechanical stability provided by the reconstituted wafer.

The use of reconstituted wafers allows dissimilar sized dies and/or wafers to be integrated into stacked ICs. Because the tier two wafer is singulated before reconstitution, the size of the tier two wafer does not affect semiconductor manufacturing. Further, because the tier two dies are assembled on the reconstituted wafer arranged to be properly aligned, with the tier one dies, the size of the tier two dies does not affect semiconductor manufacturing.

The use of reconstituted wafers may also improve the yield of the wafer-to-wafer bonded products. Because the tier two dies are singulated before being integrated into the reconstituted wafer, the tier two dies may be tested before being integrated into the reconstituted wafer.

In one embodiment, only functional tier two dies included in the reconstituted wafer. Malfunctioning tier two dies may be discarded before molding into a reconstituted wafer, saving further processing time on non-functional parts. According to another embodiment, functional and non-functional tier two dies are picked and placed in the reconstituted wafer. For example, if certain tier one dies are known to be non-functional, the tier two dies that are non-functional are placed in the reconstituted wafer correspondingly. Thus, when the reconstituted wafer is bonded to the tier one wafer, the non-functional tier one and tier two dies are aligned, with each other.

One advantageous implementation of wafer-to-wafer bonding as described above is in construction of a stacked IC. Semiconductor assembly of a stacked IC using exemplary bonding of dissimilar size dies and/or wafers will be described below in FIGS. 6A-6F.

Figure 6A:
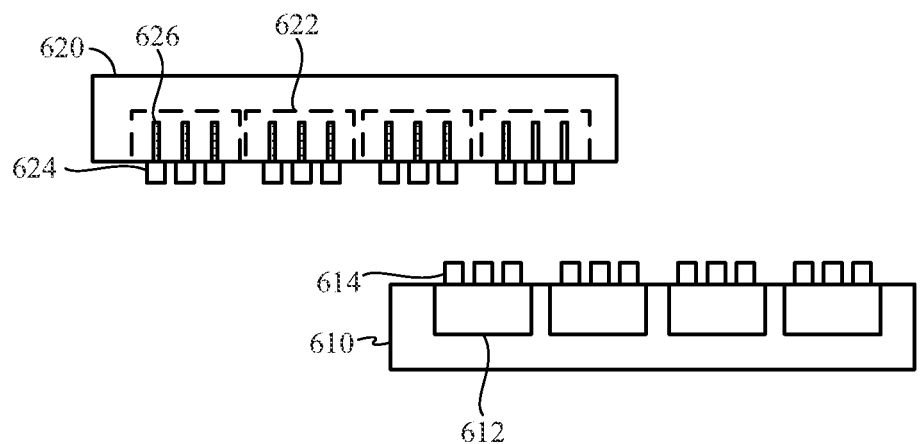
FIG. 6A is a cross-sectional view illustrating two wafers before an exemplary bonding of dissimilar size dies and/or wafers according to one embodiment.

FIG. 6A is a cross-sectional view illustrating two wafers before an exemplary bonding of dissimilar size dies and/or wafers according to one embodiment. A reconstituted wafer 610 includes tier two dies 612 and an interconnect structure 614 such as microbumps or pillars. A tier one wafer 620 includes tier one dies 622 and an interconnect structure 624. Through silicon vias 626 in the tier one wafer 620 may be coupled to the interconnect structure 624. The through silicon vias 626 may couple the interconnect structure 624 to a packaging connection after other semiconductor manufacturing. The tier one dies 622 and the tier two dies 612 may be of dissimilar size. Additionally, the tier one wafer 620 and a wafer (not shown) from which the tier two dies 612 are diced may be of dissimilar size.

The tier two dies 612 are arranged in the reconstituted wafer 610 according to the tier one dies 622 in the tier one wafer 620. That is, the placement of the tier two dies 612 in the reconstituted wafer 610 aligns the interconnect structure 624 and the interconnect structure 614.

One advantage of the wafer-to-wafer bonding described below is parallel processing of the tier one wafer 620 and the reconstituted wafer 610. The tier one wafer 620 and the reconstituted wafer 610 may be manufactured at different locations and/or on different tools or fabrication lines. As a result, efficiency of stacked IC manufacturing is improved.

Additionally, the tier two dies 612 may be singulated from multiple wafers (as described with respect to FIG. 7A-D). In this embodiment, each of the tier one dies 622 may be coupled to multiple tier two dies of different sizes singulated from different wafers, possibly of different sizes.

Figure 6B:
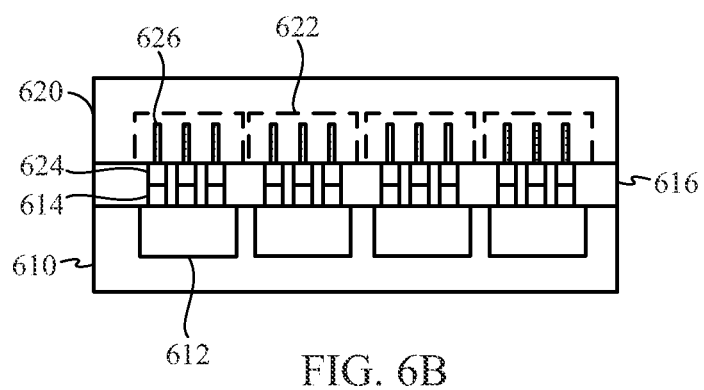
FIG. 6B is a cross-sectional view illustrating an exemplary bonding of dissimilar size dies and/or wafers according to one embodiment.

FIG. 6B is a cross-sectional view illustrating an exemplary bonding of dissimilar size dies and/or wafers according to one embodiment. The interconnect structure 614 is coupled to an interconnect structure 624, such as microbumps or pillars, of a tier one wafer 620 having through Silicon vias 626. According to one embodiment, when the reconstituted wafer 610 is molded to the tier one wafer 620, the interconnect structure 624 aligns with the interconnect structure 614. A molding compound 616 mounts the tier one wafer 620 to the reconstituted wafer 610.

Figure 6C:
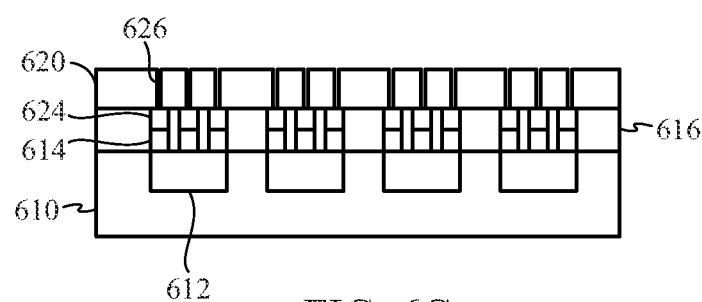
FIG. 6C is a cross-sectional view illustrating an exemplary bonding of dissimilar size dies and/or wafers after thinning according to one embodiment.

FIG. 6C is a cross-sectional view illustrating an exemplary bonding of dissimilar size dies and/or wafers after thinning according to one embodiment. The tier one wafer 620 is thinned, but is less at risk from damage due to mechanical stability provided by the reconstituted wafer 610. The tier one wafer 620, after thinning according to one embodiment, is a thickness of less than 100 mm and exposes the through silicon vias 626. At this thickness, the tier one wafer 620 may not have mechanical strength to withstand future semiconductor manufacturing processes without the additional mechanical strength provided by the reconstituted wafer 610. Although this example includes through silicon vias in the tier one dies, through silicon vias can be provided in the tier two dies, either in addition or as an alternative.

Figure 6D:
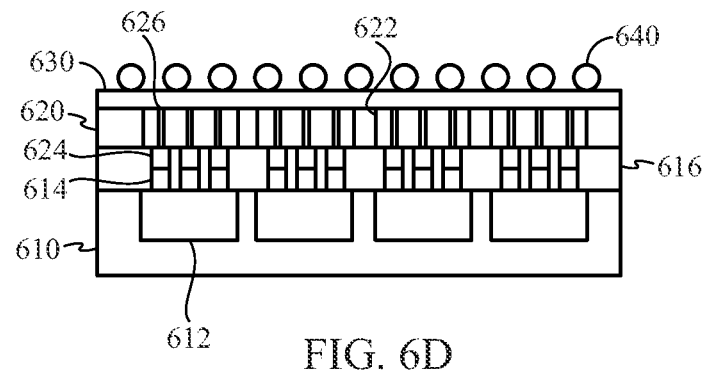
FIG. 6D is a cross-sectional view illustrating an exemplary bonding of dissimilar size dies and/or wafers after semiconductor manufacturing according to one embodiment.

FIG. 6D is a cross-sectional view illustrating an exemplary bonding of dissimilar size dies and/or wafers after semiconductor manufacturing according to one embodiment. Additional film layers 630 may be deposited in the tier one wafer 620 along with an interconnect structure 640 such microbumps or pillars. The additional film layers 630 may include, for example, a redistribution layer (RDL) or an isolation layer. The additional film layers 630 may also include layers patterned by photolithography processes.

Figure 6E:
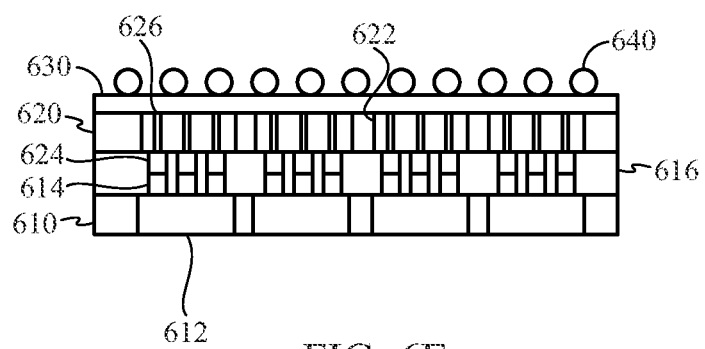
FIG. 6E is a cross-sectional view illustrating an exemplary bonding of dissimilar size dies and/or wafers after thinning according to one embodiment.

FIG. 6E is a cross-sectional view illustrating an exemplary bonding of dissimilar size dies and/or wafers after thinning according to one embodiment. The reconstituted wafer 610 may be further thinned after the additional film layers 630 are deposited. Thinning of the reconstituted wafer 610 may be accomplished through grinding. According to one embodiment, the tier two dies 612 are thinned before the reconstituted wafer 610 is bonded with the tier one wafer 620. In this case, combined grinding of molding compound and silicon may be reduced. That is, before the reconstituted wafer 610 is bonded with the tier one wafer 620 the molding compound of the reconstituted wafer 610 is thinned. In one embodiment, the surface of the molding compound is made flush with the tier two dies 612.

Figure 6F:
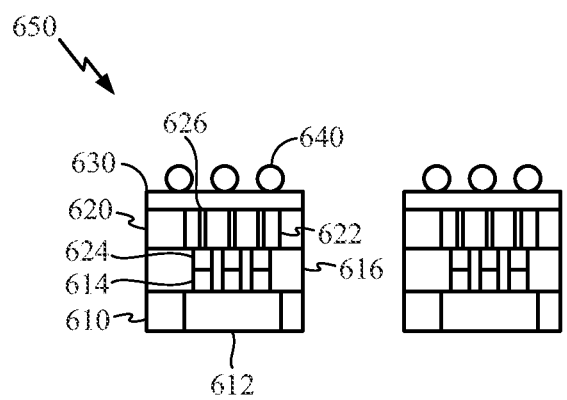
FIG. 6F is a cross-sectional view illustrating an exemplary bonding of dissimilar size dies and/or wafers after singulating according to one embodiment.

FIG. 6F is a cross-sectional view illustrating an exemplary bonding of dissimilar size dies and/or wafers after singulating according to one embodiment. Dies 650 are diced or singulated from the bonded tier one wafer 620 and the reconstituted wafer 610.

FIGS. 7A-7D are block diagrams illustrating a top-down view of an exemplary stacking of dissimilar size dies and/or wafers according to one embodiment. Bonding of dissimilar size dies and/or wafers as described above allows construction of customized stacked dies.

Customized stacked dies may include multiple dies in a tier of a stacked IC. For example, a second tier of a stacked IC may include two or more dies, side by side, that cumulatively consume die area up to the die area of the first tier die. The second tier dies can originate from different wafers. One such embodiment will be described below. Additionally, the customized stacked dies may include multiple tiers within each tier. For example, one tier may be a stacked memory die and the other tier may be a processor.

Figure 7A:
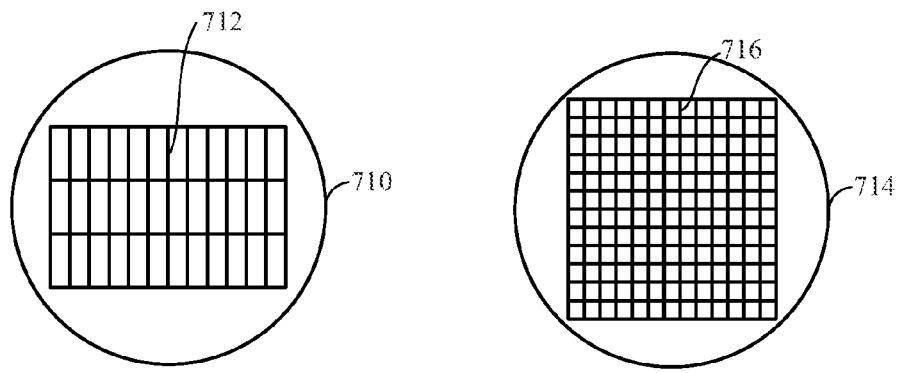
FIG. 7A is a top-down view illustrating wafers from which the tier two dies are singulated, according to one embodiment.

FIG. 7A is a top-down view illustrating wafers from which the tier two dies are singulated, according to one embodiment. A first wafer 710 includes dies 712 and a second wafer 714 includes dies 716. The dies 716 and the dies 712 are dissimilar in size relative to the tier one dies. The wafers from which the tier two dies originate may also be dissimilar in size relative to the tier one wafer.

Figure 7B:
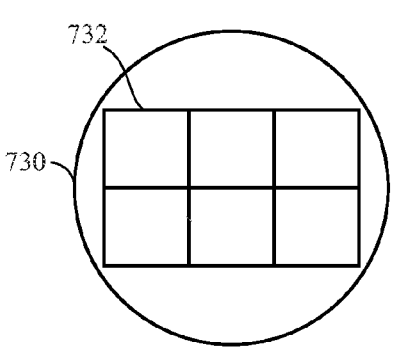
FIG. 7B is a top-down view illustrating a tier one wafer according to one embodiment.

FIG. 7B is a top-down view illustrating a tier one wafer according to one embodiment. A wafer 730 includes dies 732. Size of the dies 732 may be dissimilar from the dies 712, 716.

Figure 7C:
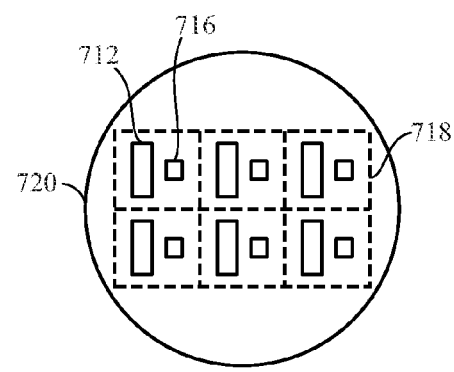
FIG. 7C is a top-down view illustrating a reconstituted wafer according to one embodiment.

FIG. 7C is a top-down view illustrating a reconstituted wafer according to one embodiment. After singulating or dicing the dies 712 from the first wafer 710 and the dies 716 from the second wafer 714, the dies 712, 716 may be molded on a reconstituted wafer 720. A spacing 718 of the dies 712, 716 on the reconstituted wafer 720 is chosen, in part, based on the layout and pitch of the dies 732 on a wafer 730. Thus, when the reconstituted wafer 720 is bonded to the wafer 730 the dies 712, 716 overlap the dies 732. Additionally, interconnects (not shown) of the dies 712, 716 align with interconnects on the dies 732.

Figure 7D:
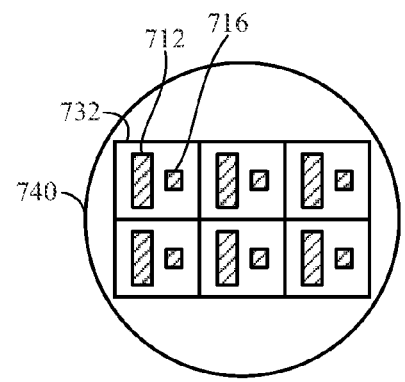
FIG. 7D is a top-down view illustrating a stacked wafer after exemplary wafer-to-wafer bonding according to one embodiment.

FIG. 7D is a top-down view illustrating a stacked wafer after exemplary wafer-to-wafer bonding according to one embodiment. The reconstituted wafer 720 and the wafer 730 are bonded according to the wafer-to-wafer bonding described in FIG. 5 to form a bonded wafer stack 740. The dies 712, 716 of a first tier, and the dies 732 of a second tier overlap interconnect structures (not shown) on the dies 712 and the dies 716. Interconnects on the dies 732 are arranged to contact interconnects on the dies 712, 716.

Figure 8:
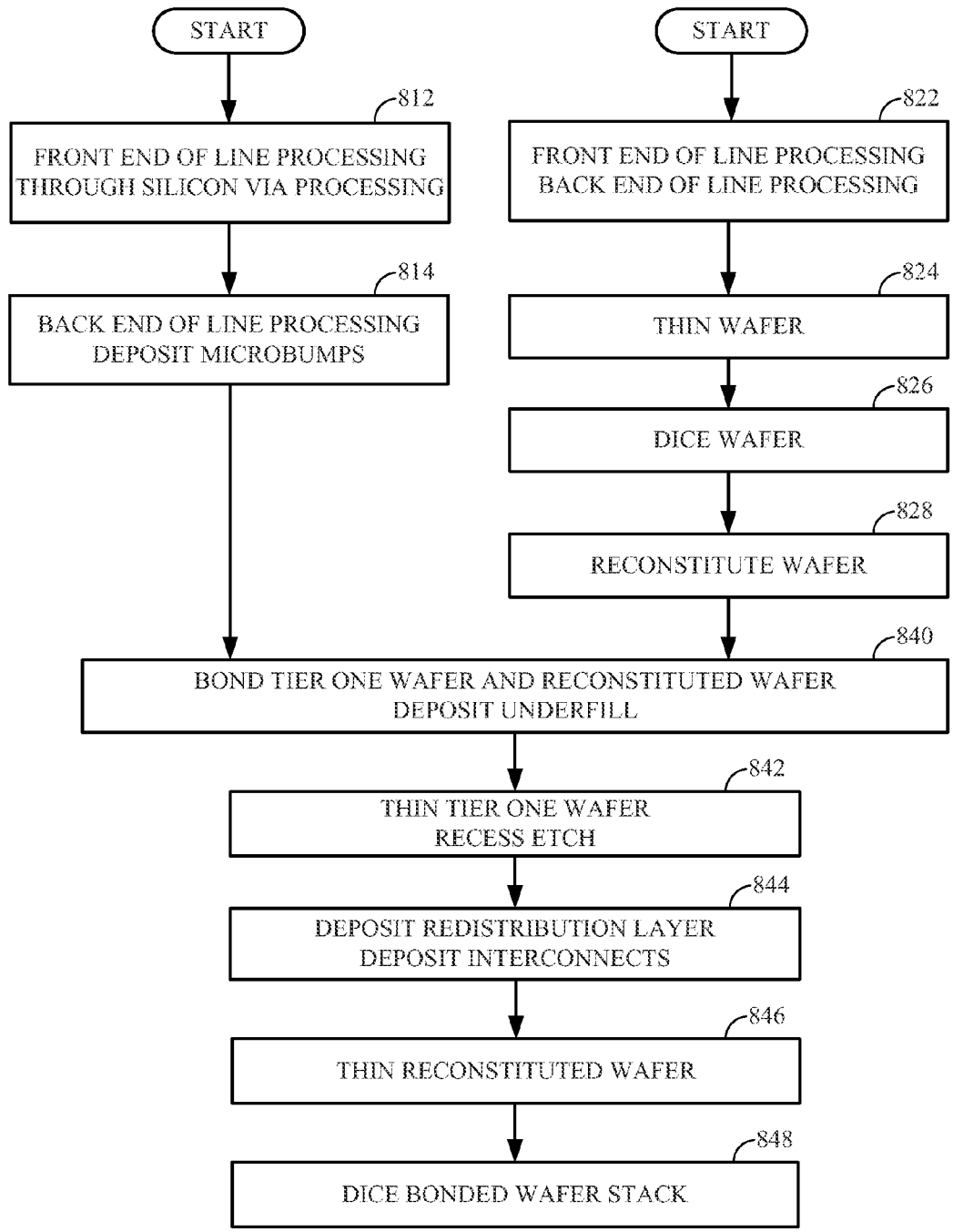
FIG. 8 is a flow chart illustrating an exemplary process for construction of a stacked. IC according to one embodiment.

FIG. 8 is a flow chart illustrating an exemplary process for construction of a stacked IC according to one embodiment. A stacked IC includes two or more dies. Each die of the stacked IC is manufactured on a separate wafer. At block 812 front end of line (FEOL) processing is performed along with forming through silicon vias in the tier one wafer. Through silicon vias in the tier one wafer may not extend the full height of the tier one wafer. At block 814 back end of line (BEOL) processing is carried out on the tier one wafer. Additionally, at block 814, microbumps are deposited on a surface of the tier one wafer.

At block 822 front end of line (FEOL) processing is performed along with back end of line (BEOL) processing on the wafer from which tier two dies are signaled. The wafer from which tier two dies are singulated may be of a different size than the tier one wafer. Additionally, the wafer from which tier two dies are singulated may be manufactured at a different location that the tier one wafer or the reconstituted wafer.

At block 824, the wafer from which tier two dies are singulated is thinned. Alternatively, thinning of the tier two dies is not be performed until after the tier two dies are bonded in a reconstituted wafer.

At block 826, the wafer is singulated into tier two dies. Selecting an appropriate layout of the reconstituted wafer allows the size of the dies diced from the wafer to be dissimilar from the size of the subsequently formed stacked die.

At block 828, the tier two dies are molded to form a reconstituted wafer. Spacing of the tier two dies may be based, in part, on the size of tier one dies to which the tier two dies will be bonded. Alternatively, spacing of the tier two dies may be used to align tier two dies with a specific region of the tier one dies, for example in the case when multiple tier two dies will be bonded to each tier one die.

At block 840, the reconstituted wafer and the tier one wafer are bonded together and underfill deposited between the reconstituted wafer and the tier one wafer. At block 842, the tier one wafer is thinned to expose through silicon vias in the tier one wafer. A recess etch may follow thinning of the tier one wafer. At block 844, a redistribution layer (RDL) and an interconnect structure (e.g., flip chip bumps) are deposited on the bonded wafer.

At block 846, the reconstituted wafer may be thinned. According to one embodiment, the reconstituted wafer is thinned along with tier two dies in the reconstituted wafer.

Alternatively, the reconstituted wafer may have been previously thinned to expose the tier two dies, in which case further thinning of tier two dies may be performed. At block 848, the bonded wafer stack is diced or singulated to form individual dies.

Bonding of dissimilar size dies and/or wafers as described above offers a wafer-to-wafer bonding process with high throughput. Additionally, the exemplary wafer-to-wafer processing may include wafers manufactured at different locations with different technologies and processes. A supply chain for the semiconductor manufacturing may be optimized by manufacturing separate tiers of a stacked IC at different locations and bonding at another location. At each location, whether locations are separate fabrication sites or separate locations within a single fabrication site, bottleneck processes for manufacturing each wafer may be separated out. The reconstituted wafer is used in the above semiconductor manufacturing process in a limited capacity during molding, reducing problems with adhesives used during semiconductor assembly. Further, the semiconductor manufacturing described above leverages existing processes to minimize cost and time consumed during manufacturing.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor manufacturing process for wafer-to-wafer bonding of a first wafer having a first plurality of dies of a first die size to a reconstituted wafer having a second plurality of dies of a second die size different than the first die size, the process comprising:
   aligning the second plurality of dies, having a spacing between the second plurality of dies based on parameters of the first plurality of dies, such that a second plurality of interconnects on the second plurality of dies aligns with a first plurality of interconnects on the first plurality of dies; and
   coupling the reconstituted wafer with the first wafer to create a wafer stack.

2. The process of claim 1, further comprising:
   singulating the second plurality of dies from a third wafer before aligning the second plurality of dies; and
   molding the singulated second plurality of dies into the reconstituted wafer.

3. The process of claim 2, further comprising:
   singulating a third die from a fourth wafer; and
   molding the third die into the reconstituted wafer.

4. The process of claim 3, further comprising arranging the third die proximate to a second die of the second plurality of dies such that the third die overlaps with a first portion of a first die of the first plurality of dies and the second die of the second plurality of dies overlaps with a second portion of the first die before molding.

5. The process of claim 2, in which singulating the second plurality of dies from the third wafer comprises singulating the second plurality of dies from the third wafer of different size than the first wafer.

6. The process of claim 1, in which the first wafer is substantially a same size as the reconstituted wafer.

7. The process of claim 1, further comprising stacking at least one additional wafer on the wafer stack.

8. The process of claim 7, in which the at least one additional wafer comprises another reconstituted wafer.

9. The process of claim 1, in which a second die of the second plurality of dies comprises multiple tiers.

10. The process of claim 9, in which the second die comprises a vertically stacked memory device.

11. The process of claim 1 further comprising integrating the wafer stack into a music player, a video player, an entertainment unit, a navigation device, a communications device, a personal digital assistant (PDA), a fixed location data unit, and/or a computer.

12. A semiconductor manufacturing process for wafer-to-wafer bonding of a first wafer having a first plurality of dies of a first die size to a reconstituted wafer having a second plurality of dies of a second die size different than the first die size, the process comprising:
    step for aligning the second plurality of dies, having a spacing between the second plurality of dies based on parameters of the first plurality of dies, such that a second plurality of interconnects on the second plurality of dies aligns with a first plurality of interconnects on the first plurality of dies; and
    step for coupling the reconstituted wafer with the first wafer to create a wafer stack.

13. The process of claim 12, further comprising:
    step for singulating the second plurality of dies from a third wafer before aligning the second plurality of dies.

14. The process of claim 13, further comprising:
    step for molding the singulated second plurality of dies into the reconstituted wafer.

15. The process of claim 14, further comprising:
    step for singulating a third die from a fourth wafer; and
    step for molding the third die into the reconstituted wafer.

16. The process of claim 15, further comprising:
    step for arranging the third die proximate to a second die of the second plurality of dies such that the third die overlaps with a first portion of a first die of the first plurality of dies and the second die of the second plurality of dies overlaps with a second portion of the first die of the first plurality of dies before molding.

17. The process of claim 13, further comprising:
    step for singulating the second plurality of dies from the third wafer by singulating the second plurality of dies from the third wafer of different size than the first wafer.

18. The process of claim 12, further comprising:
    step for stacking at least one additional wafer on the water stack.

19. The process of claim 18 in which the at least one additional wafer comprises another reconstituted wafer.

20. The process of claim 12, further comprising:
    step for integrating the wafer stack into a music player, a video player, an entertainment unit, a navigation device, a communications device, a personal digital assistant (PDA), a fixed location data unit, and/or a computer.

* * * * *